(12) United States Patent
Lee et al.

(10) Patent No.: US 10,699,789 B2
(45) Date of Patent: Jun. 30, 2020

(54) NONVOLATILE MEMORY DEVICE AND MEMORY SYSTEM INCLUDING NONVOLATILE MEMORY DEVICE THAT CONTROLS THE ERASE SPEEDS OF CELL STRINGS

(71) Applicant: SAMSUNG ELECTRONICS CO., LTD., Suwon-si, Gyeonggi-do (KR)

(72) Inventors: Sunyeong Lee, Hwaseong-si (KR); Kyungmoon Kim, Seosan-si (KR); Woojae Jang, Hwaseong-si (KR); Chanjong Ju, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/177,479

(22) Filed: Nov. 1, 2018

(65) Prior Publication Data
US 2019/0279719 A1  Sep. 12, 2019

(30) Foreign Application Priority Data

Mar. 9, 2018 (KR) ........................ 10-2018-0028029

(51) Int. Cl.
| | | |
|---|---|---|
| G11C 7/00 | (2006.01) | |
| G11C 16/16 | (2006.01) | |
| H01L 27/11582 | (2017.01) | |
| H01L 27/1157 | (2017.01) | |
| G11C 16/34 | (2006.01) | |
| G11C 16/08 | (2006.01) | |
| G11C 16/24 | (2006.01) | |
| G11C 16/26 | (2006.01) | |
| G11C 16/04 | (2006.01) | |

(52) U.S. Cl.
CPC .......... *G11C 16/16* (2013.01); *G11C 16/0483* (2013.01); *G11C 16/08* (2013.01); *G11C 16/24* (2013.01); *G11C 16/26* (2013.01); *G11C 16/3472* (2013.01); *H01L 27/1157* (2013.01); *H01L 27/11582* (2013.01)

(58) Field of Classification Search
CPC ..... G11C 16/16; G11C 16/26; G11C 16/3472; G11C 16/0483; G11C 16/08; G11C 16/24; H01L 27/1157; H01L 27/11582
USPC ........................................................ 365/218
See application file for complete search history.

(56) References Cited

U.S. PATENT DOCUMENTS

| | | | | |
|---|---|---|---|---|
| 6,072,722 A | * | 6/2000 | Hirano | ................... G11C 16/16 365/185.13 |
| 6,888,200 B2 | * | 5/2005 | Bhattacharyya | ... G11C 16/0466 257/348 |
| 7,606,100 B2 | | 10/2009 | Hemink et al. | |

(Continued)

*Primary Examiner* — Tha-O H Bui
(74) *Attorney, Agent, or Firm* — Volentine, Whitt & Francos, PLLC

(57) ABSTRACT

A nonvolatile memory device includes a memory cell array, an erase body voltage generator, and an erase source voltage generator. The memory cell array includes memory blocks, each of which includes cell strings each including a ground selection transistor, memory cells, and a string selection transistor stacked in a direction perpendicular to a substrate. The erase body voltage generator applies an erase body voltage to the substrate during an erase operation. The erase source voltage generator applies an erase source voltage to a common source line connected with ground selection transistors of the cell strings during the erase operation.

18 Claims, 10 Drawing Sheets

(56) References Cited

U.S. PATENT DOCUMENTS

| | | |
|---|---|---|
| 7,679,133 B2 | 3/2010 | Son et al. |
| 8,553,466 B2 | 10/2013 | Han et al. |
| 8,559,235 B2 | 10/2013 | Yoon et al. |
| 8,619,472 B2 * | 12/2013 | Lee .................... G11C 16/0483 365/185.02 |
| 8,654,587 B2 | 2/2014 | Yoon et al. |
| 9,349,464 B2 | 5/2016 | Shiga et al. |
| 9,401,214 B2 | 7/2016 | Kwak |
| 9,704,579 B1 | 7/2017 | Bayle |
| 9,711,235 B2 | 7/2017 | Gangasani et al. |
| 9,786,378 B1 * | 10/2017 | Zhang ................ G11C 16/0483 |
| 2011/0090739 A1 * | 4/2011 | Goda ................ G11C 16/0483 365/185.18 |
| 2011/0233648 A1 | 9/2011 | Seol et al. |

* cited by examiner

NONVOLATILE MEMORY DEVICE AND MEMORY SYSTEM INCLUDING NONVOLATILE MEMORY DEVICE THAT CONTROLS THE ERASE SPEEDS OF CELL STRINGS

CROSS-REFERENCE TO RELATED APPLICATIONS

A claim for priority under 35 U.S.C. § 119 is made to Korean Patent Application No. 10-2018-0028029 filed on Mar. 9, 2018, in the Korean Intellectual Property Office, the entire content of which is hereby incorporated by reference.

BACKGROUND

The present inventive concepts herein relate to a semiconductor memory, and more particularly to a nonvolatile memory device and a memory system including the nonvolatile memory device.

Nonvolatile memory devices may include for example read only memory (ROM), programmable ROM (PROM), electrically programmable ROM (EPROM), electrically erasable and programmable ROM (EEPROM), flash memory, phase-change random access memory (PRAM), magnetic RAM (MRAM), resistive RAM (RRAM), and ferroelectric RAM (FRAM), among other types of memory.

Nonvolatile memory devices may for example be implemented in the form of a solid state drive or a memory card, as well as in other forms. Nonvolatile memory devices are typically used for storing data in various computing devices such as for example computers, smartphones, smart pads, and a wearable devices, or the like.

As semiconductor manufacturing technologies have recently developed, the degree of integration and the capacity of nonvolatile memory devices have increased. As integration of nonvolatile memory devices has increased, the manufacturing cost of nonvolatile memory devices has consequently decreased. However, along with changes in the structure of nonvolatile memory devices because of increased integration, a scale of nonvolatile memory devices has decreased, resulting in various issues.

For example, there has been a resultant decrease of the reliability of nonvolatile memory devices due to a process characteristic of the nonvolatile memory device. Accordingly, there is an increasing demand for new technology that prevents decrease in reliability of nonvolatile memory devices due to the process characteristic of the nonvolatile memory device.

SUMMARY

Embodiments of the inventive concepts prevent an erase speed of cell strings of a nonvolatile memory device from varying due to a process characteristic, and prevent reliability of the nonvolatile memory device from decreasing due to a difference of erase speeds.

Embodiments of the inventive concepts provide a nonvolatile memory device including a memory cell array that includes memory blocks, each of the memory blocks includes cell strings each including a ground selection transistor, memory cells, and a string selection transistor stacked in a direction perpendicular to a substrate. The nonvolatile memory device further includes an erase body voltage generator that applies an erase body voltage to the substrate during an erase operation, and an erase source voltage generator that applies an erase source voltage to a common source line connected with the ground selection transistor of the cell strings during the erase operation.

Embodiments of the inventive concepts further provide a nonvolatile memory device including a memory cell array that includes memory blocks, each of the memory blocks includes cell strings each including a ground selection transistor, memory cells, and a string selection transistor stacked in a direction perpendicular to a substrate. The nonvolatile memory device further includes an erase body voltage generator that applies an erase body voltage to the substrate during an erase operation. The substrate includes a common source region in a region of the substrate adjacent to the ground selection transistor of the cell strings. A conductivity of the common source region is different than a conductivity of the substrate. The nonvolatile memory device further includes an erase source voltage generator configured to apply an erase voltage to the common source region to expand the common source region during the erase body voltage.

Embodiments of the inventive concepts still further provide a memory system including a controller that issues an erase command; and a nonvolatile memory device that performs an erase operation based on the erase command. The nonvolatile memory device includes a memory cell array that includes memory blocks, each of the memory blocks including a plurality of cell strings each including a ground selection transistor, memory cells, and a string selection transistor stacked in a direction perpendicular to a substrate. The nonvolatile memory device further includes an erase body voltage generator that applies an erase body voltage to the substrate during the erase operation, and an erase source voltage generator that applies an erase source voltage to a common source line connected with the ground selection transistor of the cell strings during the erase operation.

Embodiments of the inventive concepts also provide a nonvolatile memory device including a memory cell array including memory blocks, each of the memory blocks including a plurality of cell strings extending over a substrate in a direction perpendicular to the substrate, the substrate including a common source region in a region adjacent the plurality of cell strings and connected to the plurality of cell strings; and a control circuit that adjusts erase speeds of the plurality of cell strings by applying an erase source voltage to the common source region to expand the common source region during an erase operation, and to apply an erase body voltage to the substrate during the erase operation.

BRIEF DESCRIPTION OF THE FIGURES

The above and other objects and features of the inventive concepts will become apparent in view of the following detailed description of exemplary embodiments as made with reference to the accompanying drawings.

DETAILED DESCRIPTION

Hereinafter, embodiments of the inventive concepts are described in detail and clearly to such an extent that one of ordinary one in the art may easily implement the inventive concepts.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
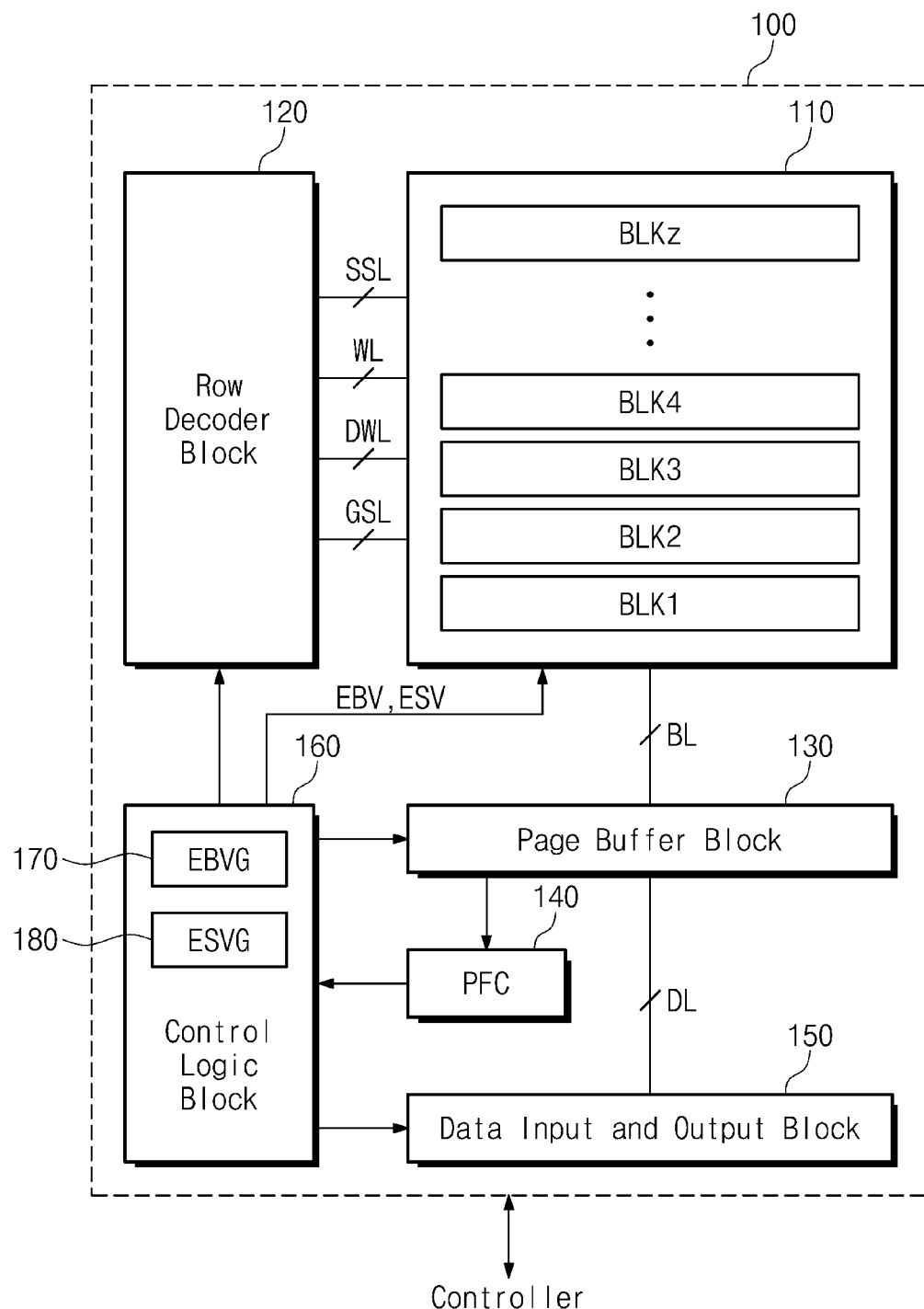
FIG. 1 illustrates a block diagram of a nonvolatile memory device according to an embodiment of the inventive concepts.

FIG. 1 illustrates a block diagram of a nonvolatile memory device 100 according to an embodiment of the inventive concepts. Referring to FIG. 1, the nonvolatile memory device 100 includes a memory cell array 110, a row decoder block 120, a page buffer block 130, a pass-fail check block (PFC) 140, a data input and output block 150, and a control logic block (i.e., a control circuit) 160.

The memory cell array 110 includes a plurality of memory blocks BLK1, BLK2, BLK3, BLK4 to BLKz. Each of the memory blocks BLK1 to BLKz includes a plurality of memory cells. Each of the memory blocks BLK1 to BLKz may be connected to the row decoder block 120 through at least one ground selection line GSL, a plurality of word lines WL, a plurality of dummy word lines DWL, and at least one string selection line SSL.

Each of the memory blocks BLK1 to BLKz may be connected to the page buffer block 130 through a plurality of bit lines BL. The plurality of memory blocks BLK1 to BLKz may be connected in common to the plurality of bit lines BL. The memory cells of the plurality of memory blocks BLK1 to BLKz may have the same structure.

In an embodiment, each of the memory blocks BLK1 to BLKz may correspond to a unit of an erase operation. The memory cells of the memory cell array 110 may be erased for each memory block. In other words, the memory cell array 110 may be erased in units of memory blocks, that is memory block by memory block. The memory cells belonging to one memory block may be erased at the same time. As another example, in another embodiment each of the memory blocks BLK1 to BLKz may be divided into a plurality of sub-blocks. Each of the plurality of sub-blocks may correspond to a unit of an erase operation.

In an embodiment, each memory block may include a plurality of physical pages, each of which includes a plurality of memory cells. A physical page may correspond to a unit of a program operation. Memory cells of each physical page may be simultaneously programmed. Each physical page may include a plurality of logical pages.

Bits which are programmed in memory cells of each physical page may constitute logical pages. First bits programmed in memory cells of each physical page may constitute a first logical page. K-th bits (K being a positive integer) programmed in the memory cells of each physical page may constitute a k-th logical page.

The row decoder block 120 is connected to the memory cell array 110 through the plurality of ground selection lines GSL, the plurality of word lines WL, the plurality of dummy word lines DWL, and the plurality of string selection lines SSL. The row decoder block 120 operates under control of the control logic block 160.

The row decoder block 120 may decode an address received from a controller through an input and output channel and may control voltages to be applied to the string selection lines SSL, the word lines WL, the dummy word lines DWL, and the ground selection lines GSL depending on the decoded address. For example, in a write (program) operation, the row decoder block 120 may apply a program voltage to a selected word line of a memory block selected by the address and may apply a pass voltage to unselected word lines of the selected memory block.

As a further example, in a read operation, the row decoder block 120 may apply a selection read voltage to a selected word line of a memory block selected by the address and may apply a non-selection read voltage to unselected word lines of the selected memory block. In an erase operation, the row decoder block 120 may apply an erase word line voltage (e.g., a ground voltage, or low voltages having levels which are similar to that of the ground voltage) to word lines of a memory block selected by the address.

The page buffer block 130 is connected to the memory cell array 110 through the plurality of bit lines BL. The page buffer block 130 is connected with the data input and output block 150 through a plurality of data lines DL. The page buffer block 130 operates under control of the control logic block 160.

During the program operation, the page buffer block 130 may store data to be programmed in memory cells. The page buffer block 130 may apply voltages to the plurality of bit lines BL based on the stored data. In the read operation or a verification read operation, the page buffer block 130 may sense voltages of the bit lines BL and may store a result of the sensing.

After the verification read operation, the pass-fail check block 140 may receive the sensing result from the page buffer block 130. The pass-fail check block 140 may determine a pass or a fail, based on the received sensing result.

For example, in a program verification operation, the page buffer block 130 may count the number of on-cells, which are turned on in a verification read operation, from the result of the verification read operation. When the number of on-cells is not smaller than a threshold value, the pass-fail check block 140 may determine a fail state of the program operation. When the number of on-cells is smaller than the threshold value, the pass-fail check block 140 may determine a pass state of the program operation.

For example, in an erase verification operation, the page buffer block 130 may count the number of off-cells, which are turned off in a verification read operation, from the result of the verification read operation. When the number of off-cells is not smaller than a threshold value, the pass-fail check block 140 may determine a fail state of the erase operation. When the number of off-cells is smaller than the threshold value, the pass-fail check block 140 may determine a pass state of the erase operation. A result of the pass or fail determination is provided to the control logic block 160.

The data input and output block 150 is connected with the page buffer block 130 through the plurality of data lines DL. The data input and output block 150 may output data read by the page buffer block 130 to the controller through the input and output channel and may transmit data received from the controller through the input and output channel to the page buffer block 130.

The control logic block 160 may receive a control signal through a control channel from the controller. In response to the control signal, the control logic block 160 may receive a command through the input and output channel. In response to the control signal, the control logic block 160 may route an address received through the input and output channel to the row decoder block 120.

In response to the control signal, the control logic block 160 may route data received through the input and output channel to the data input and output block 150. The control logic block 160 may decode the received command and may control the nonvolatile memory device 100 depending on the decoded command.

For example, under control of the control logic block 160, the program, read or erase operations of the nonvolatile memory device 100 may be performed depending on an erase command, a write command, or a read command.

The control logic block 160 may include an erase body voltage generator (EBVG) 170 and an erase source voltage generator (ESVG) 180. The erase body voltage generator 170 may generate an erase body voltage EBV. The erase body voltage EBV may be applied to a substrate 101 (refer to FIGS. 2 and 3) of the memory cell array 110 in the erase operation.

The erase source voltage generator 180 may generate an erase source voltage ESV. The erase source voltage ESV may be applied to a common source line CSL (refer to FIG. 2) of the memory cell array 110 in the erase operation. For example, the erase source voltage ESV may be applied to common source lines of the memory blocks BLK1 to BLKz or to a common source line of a memory block selected from the memory blocks BLK1 to BLKz.

For example, a level of the erase source voltage ESV may be different from a level of the erase body voltage EBV. The level of the erase source voltage ESV may be higher than the level of the erase body voltage EBV.

Figure 2:
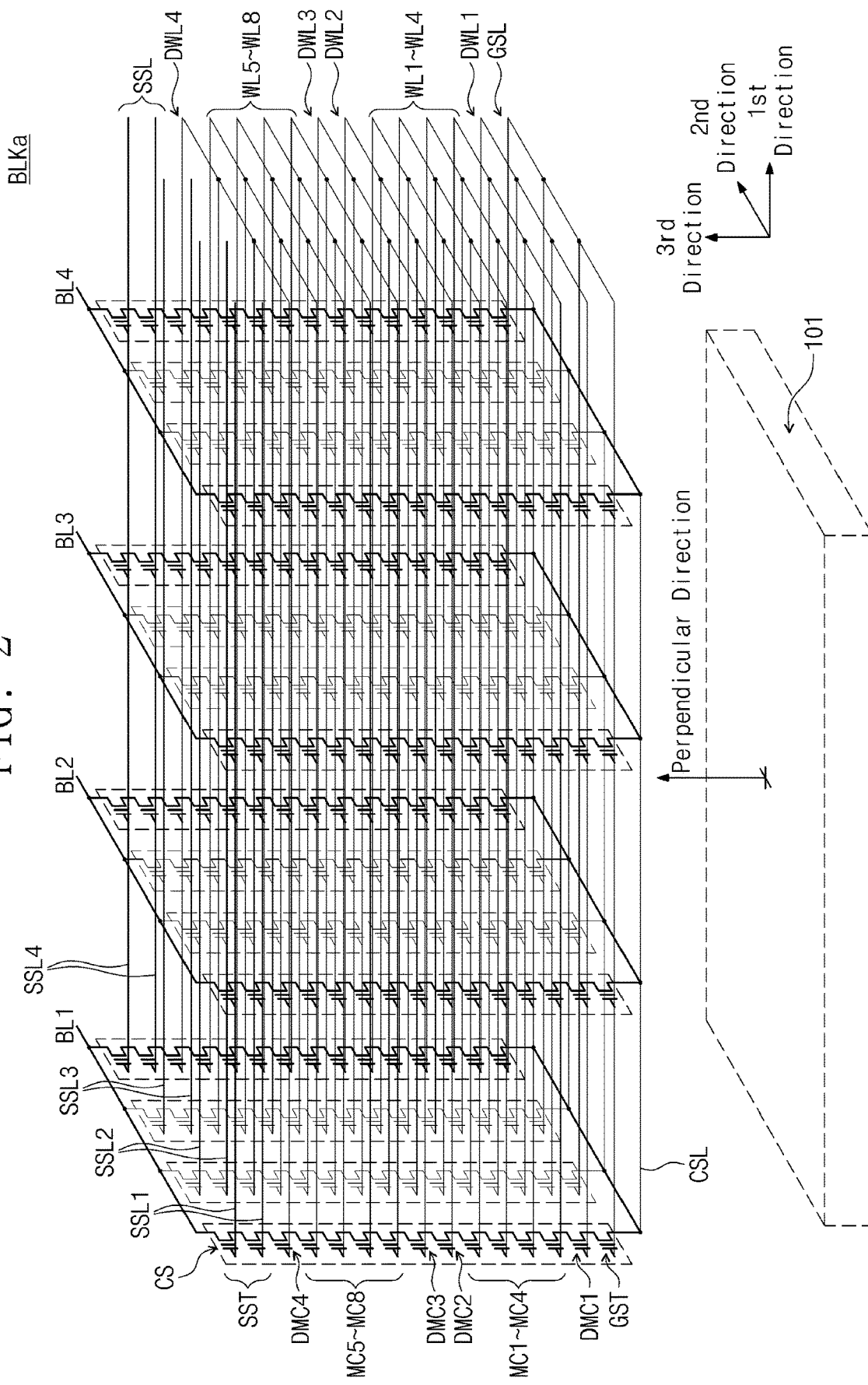
FIG. 2 illustrates a circuit diagram of an example of one memory block of memory blocks of FIG. 1.

FIG. 2 illustrates a circuit diagram of an example of one memory block BLKa of the memory blocks BLK1 to BLKz of FIG. 1. Referring to FIG. 2, a plurality of cell strings CS may be arranged on a substrate 101 along a first direction (e.g., a row direction) and a second direction (e.g., a column direction).

The plurality of cell strings CS may be connected with first to fourth bit lines BL1, BL2, B13 and BL4 extending along the second direction. Cell strings CS positioned at the same column may be connected with the same bit line. The plurality of cell strings CS may include cell transistors stacked along a third direction (e.g., a height direction) perpendicular to the substrate 101.

For example, the cell transistors may be used as ground selection transistors GST, dummy memory cells DMC1, DMC2, DMC3 and DMC4, memory cells MC1 to MC4 and MC5 to MC8, and string selection transistors SST. For example, the cell transistors may have the same structure.

The memory block BLKa is exemplified in FIG. 2 as including cell strings CS corresponding to four rows and four columns. However, the number of cell strings included in the memory block BLKa is not limited to the example of FIG. 2. Also, the number of cell transistors included each cell string CS is not limited to the example of FIG. 2.

Figure 3:
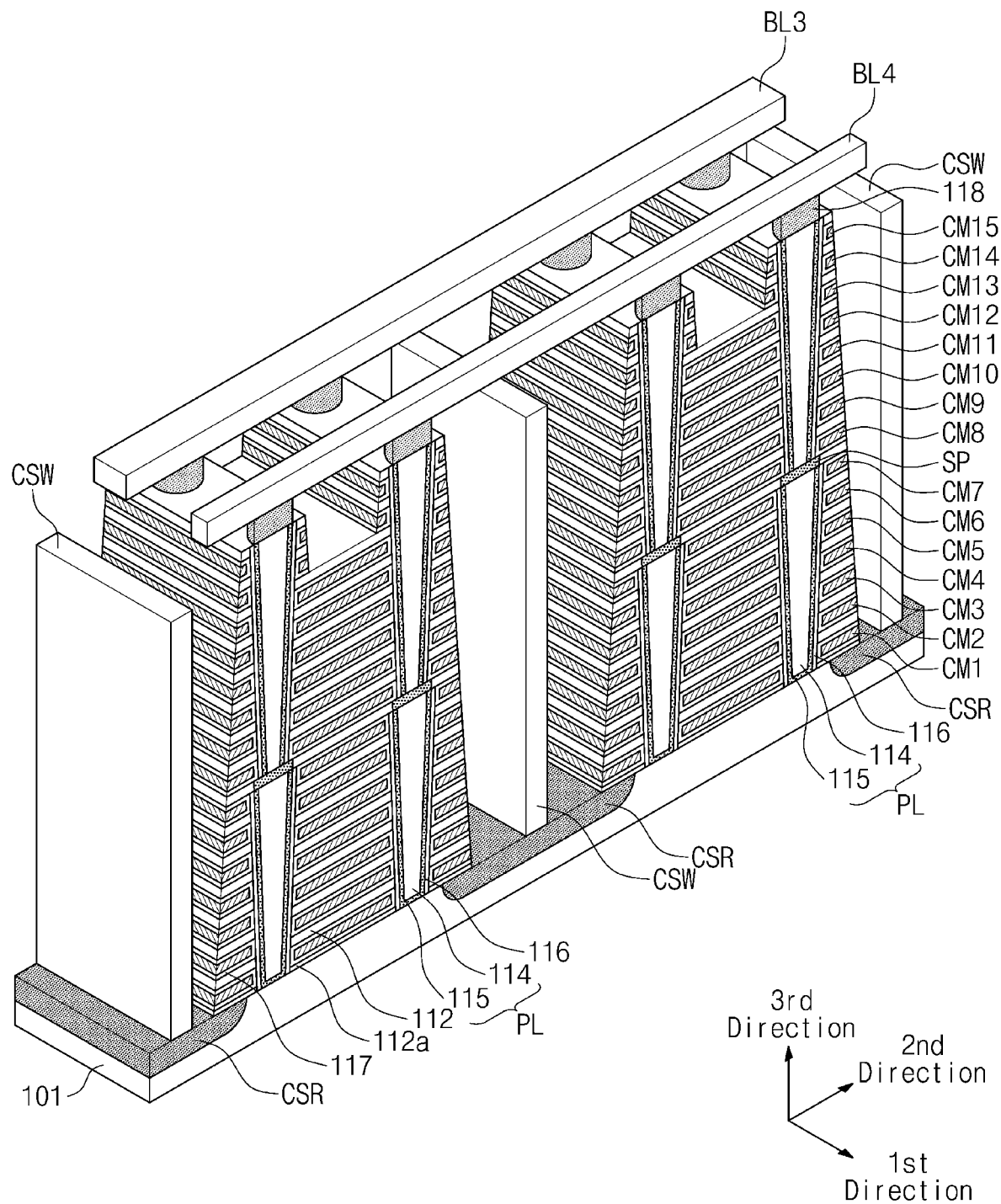
FIG. 3 illustrates a perspective sectional view of an exemplary structure of cell strings corresponding to third and fourth bit lines.

FIG. 3 is a perspective sectional view illustrating an exemplary structure of the cell strings CS corresponding to the third and fourth bit lines BL3 and BL4. Referring to FIGS. 2 and 3, common source regions CSR which extend along the first direction and are spaced from each other along the second direction are provided on the substrate 101.

In an embodiment, the substrate 101 may include a P-type semiconductor material. The common source regions CSR may include an N-type semiconductor material. Common source walls CSW may be provided on the common source regions CSR. The common source walls CSW may include a material of a high conductivity, for example, a metal.

Like the common source regions CSR, the common source walls CSW may extend along the first direction and may be spaced from each other along the second direction. The common source walls CSW may extend along a third direction and may have upper surfaces higher than an upper surface of the substrate 101. The common source regions CSR and the common source walls CSW may be connected in common to each other to form a common source line CSL.

Between the common source regions CSR or the common source walls CSW, insulating layers 112 and 112*a* are sequentially stacked on the substrate 101 along the third direction perpendicular to the substrate 101. The insulating layers 112 and 112*a* may be spaced from each other along the third direction. In an embodiment, the insulating layers 112 and 112*a* may include silicon oxide or silicon nitride.

In an embodiment, from among the insulating layers 112 and 112*a*, the thickness (e.g., a thicknesses along the third direction) of the insulating layer 112*a*, which is in contact with the substrate 101, may be thinner (i.e., less) than the thickness (e.g., along thicknesses of the third direction) of each of the remaining insulating layers 112.

Pillars PL which are positioned to be spaced from each other along the first direction and the second direction and penetrate the insulating layers 112 and 112*a* along the third direction are provided between the common source regions CSR or the common source walls CSW. In an embodiment, the pillars PL may be in contact with the substrate 101 through the insulating layers 112 and 112a. Each of the pillars PL may include an inner material 114, a channel layer 115, and a first insulating layer 116.

The inner material 114 may include an insulating material or an air gap. The channel layer 115 may include a P-type semiconductor material or an intrinsic semiconductor material. The first insulating layer 116 may include one or more insulating layers (e.g., different insulating layers) such as for example a silicon oxide layer, a silicon nitride layer, and an aluminum oxide layer.

Between the common source regions CSR or the common source walls CSW, second insulating layers 117 are provided on upper surfaces and lower surfaces of the insulating layers 112 and 112a, and exposed outer surfaces of the pillars PL. The second insulating layers 117 provided on an upper surface of the uppermost insulating layer among the insulating layers 112 and 112a may be removed.

In each of the pillars PL, the first insulating layer 116 and the second insulating layer 117 may be coupled adjacent to each other to form an information storage layer. For example, the first insulating layer 116 and the second insulating layer 117 may include an oxide-nitride-oxide (ONO) or oxide-nitride-aluminum (ONA). The first insulating layer 116 and the second insulating layer 117 may form a tunneling insulating layer, a charge trap layer, and a blocking insulating layer.

Between the common source regions CSR or the common source walls CSW and between the insulating layers 112 and 112a, conductive materials CM1 to CM15 (i.e., CM1, CM2, CM3, CM4, CM5, CM6, CM7, CM8, CM9, CM10, CM11, CM12, CM13, CM14, CM15), are provided on exposed outer surfaces of the second insulating layers 117. The conductive materials CM1 to CM15 may include a metallic conductive material. Drains 118 are provided on the pillars PL. In an embodiment, the drains 118 may include an N-type semiconductor material (e.g., silicon). In an embodiment, the drains 118 may be in contact with upper surfaces of the channel layers 115 in the pillars PL.

The third and fourth bit lines BL3 and BL4 which extend along the second direction and are spaced from each other along the first direction are provided on the drains 118. The third and fourth bit lines BL3 and BL4 are connected with the drains 118. In an embodiment, the drains 118 and the third and fourth bit lines BL3 and BL4 may be connected to each other through contact plugs. The third and fourth bit lines BL3 and BL4 may include a metallic conductive material.

The pillars PL form the cell strings CS together with the first and second insulating layers 116 and 117 and the conductive materials CM1 to CM15. The pillars PL form cell strings together with the first and second insulating layers 116 and 117 and the adjacent conductive materials CM1 to CM15.

The first conductive materials CM1 may form ground selection transistors GST together with the adjacent insulating layers 116 and 117 and the channel layers 115. The first conductive materials CM1 may extend along the first direction and may be connected in common to form the ground selection line GSL. As the first conductive materials CM1 are connected in common, the ground selection transistors GST may be connected in common to the ground selection line GSL.

In an embodiment, the first conductive materials CM1 may be connected in common to each other at a height at which the first conductive materials CM1 are formed, or at a height greater than the height at which the first conductive materials CM1 are formed. Hereinafter, that specific conductive materials are connected in common may be understood to mean that the conductive materials are connected in common to each other at their own height or at a height greater than their own height.

The second conductive materials CM2 may form the first dummy memory cells DMC1 together with the adjacent insulating layers 116 and 117 and the channel layers 115. The second conductive materials CM2 may extend along the first direction and may be connected in common to form a first dummy word line DWL1. As the second conductive materials CM2 are connected in common, the first dummy memory cells DMC1 may be connected in common to the first dummy word line DWL1.

As in the above description, the third to sixth conductive material CM3, CM4, CM5 and CM6 may form first to fourth memory cells MC1, MC2, MC3 and MC4 together with the adjacent insulating layers 116 and 117 and the channel layers 115. i-th conductive materials CMi (i being an integer in a range from 3 to 6) of the third to sixth conductive materials CM3 to CM6 may extend along the first direction and may be connected in common.

As the i-th conductive materials CMi are connected in common, i'-th memory cells MCi' (i' being an integer in a range from 1 to 4) may be connected in common to i'-th word lines WLi'. The third to sixth conductive material CM3 to CM6 may form first to fourth word lines WL1, WL2, WL3 and WL4, respectively.

As in the above description, the seventh and eighth conductive material CM7 and CM8 may form second and third dummy memory cells DMC2 and DMC3 together with the adjacent first and second insulating layers 116 and 117 and the channel layers 115. j-th conductive materials CMj (j being 7 or 8) of the seventh and eighth conductive materials CM7 and CM8 may extend along the first direction and may be connected in common.

As the j-th conductive materials CMj are connected in common, j'-th memory cells MCj' (i' being 2 or 3) may be connected in common to a j'-th dummy word line DWLj'. The seventh and eighth conductive material CM7 and CM8 may form second and third dummy word lines DWL2 and DWL3, respectively.

As in the above description, the ninth to twelfth conductive materials CM9, CM10, CM11 and CM12 may form fifth to eighth memory cells MC5 to MC8 together with the adjacent first and second insulating layers 116 and 117 and the channel layers 115. k-th conductive materials CMk (k being an integer in a range from 9 to 12) of the ninth to twelfth conductive materials CM9 to CM12 may extend along the first direction and may be connected in common.

As the k-th conductive materials CMk are connected in common, k'-th memory cells MCk' (k' being an integer in a range from 5 to 8) may be connected in common to k'-th word lines WLk'. The ninth to twelfth conductive materials CM9 to CM12 may form fifth to eighth word lines WL5, WL6, WL7 and WL8, respectively.

The thirteenth conductive materials CM13 may form the fourth dummy memory cells DMC4 together with the adjacent insulating layers 116 and 117 and the channel layers 115. The thirteenth conductive materials CM13 may extend along the first direction and may be connected in common to form a fourth dummy word line DWL4.

The fourteenth and fifteenth conductive materials CM14 and CM15 may form the string selection transistors SST together with the adjacent insulating layers 116 and 117 and the channel layers 115. The fourteenth and fifteenth conductive materials CM14 and CM15 may extend along the first direction and may form string selection lines SSL, respectively.

The fourteenth conductive materials CM14 may form lower string selection transistors adjacent to the memory cells MC1 to MC8 or the dummy memory cells DMC1 to DMC4. The fourteenth conductive materials CM14 may extend along the first direction and may form first to fourth string selection lines SSL1 to SSL4 (or lower string selection lines) connected with the lower string selection transistors.

The fifteenth conductive materials CM15 may form upper string selection transistors adjacent to the bit lines BL3 or BL4. The fifteenth conductive materials CM15 may extend along the first direction and may form first to fourth string selection lines SSL1 to SSL4 (or upper string selection lines) connected with the upper string selection transistors.

In each of the pillars PL, as the channel layer 115 is shared by the first to fifteenth conductive materials CM1 to CM15, the ground selection transistor GST, the first to fourth dummy memory cells DMC1 to DMC4, the first to eighth memory cells MC1 to MC8, and the string selection transistors SST in each cell string CS may be serially connected along the third direction.

The channel layer 115 in each of the pillars PL may form a vertical body of the ground selection transistor GST, the first to fourth dummy memory cells DMC1 to DMC4, the first to eighth memory cells MC1 to MC8, and the string selection transistors SST in each cell string CS.

Due to a characteristic of a process for fabricating a nonvolatile memory device such as a flash memory device for example, in a region corresponding to the first to seventh conductive materials CM1 to CM7, the width or cross-sectional area of the pillars PL may become smaller as a distance from the substrate 101 decreases or may become larger as a distance from the substrate 101 increases. Likewise, in a region corresponding to the eighth to fifteenth conductive materials CM8 to CM15, the width or cross-sectional area of the pillars PL may become smaller as a distance from the substrate 101 decreases or may become larger as a distance from the substrate 101 increases.

For example, the width or cross-sectional area of each pillar PL may refer to the width or area of a section viewed upon cutting the pillars PL along a plane parallel to the upper surface of the substrate 101. In a region corresponding to the seventh and eighth conductive materials CM7 and CM8, the pillars PL may include a silicon pad SP.

The silicon pad SP may be interposed between the channel layers 115 of the region corresponding to the first to seventh conductive materials CM1 to CM7, and the channel layers 115 of the region corresponding to the eighth to fifteenth conductive materials CM8 to CM15. The silicon pad SP may be formed of the same material as the channel layers 115. The silicon pad SP may include intrinsic silicon or P-type silicon.

For example, the first to eighth memory cells MC1 to MC8 may be programmed to have threshold voltages corresponding to various program states depending on write data in a write operation and may be erased to have threshold voltages corresponding to an erase state in an erase operation.

The first to fourth dummy memory cells DMC1 to DMC4 may be controlled to have threshold voltages within a specific range. The first to fourth dummy memory cells DMC1 to DMC4 may be write- or erase-inhibited during the write operation or the erase operation of the first to eighth memory cells MC1 to MC8. A separate write operation or a separate erase operation may be performed to control the threshold voltages of the first to fourth dummy memory cells DMC1 to DMC4 within a specific range.

As in the first to fourth dummy memory cells DMC1 to DMC4, the string selection transistors SST and the ground selection transistors GST may be controlled to have threshold voltages within a specific range.

In an embodiment, memory cells which are positioned at the same height and are associated with one of the string selection lines SSL1, SSL2, SSL3, or SSL4 may form one physical page. Memory cells of one physical page may be connected to one sub-word line. Sub-word lines of physical pages positioned at the same height may be connected in common to one word line.

The memory block BLKa may be implemented as part of a three-dimensional (3D) memory array. The 3D memory array is monolithically formed in one or more physical levels of arrays of memory cells MC having an active area positioned above a substrate 101 and a circuitry associated with the operation of those memory cells MC. The circuitry associated with an operation of memory cells MC may be located above or within such substrate. The term "monolithic" means that layers of each level of the array are directly deposited on the layers of each underlying level of the 3D memory array.

In an embodiment of the inventive concepts, the 3D memory array includes vertical cell strings CS (or NAND strings) that are vertically oriented such that at least one memory cell is located over another memory cell. The at least one memory cell may comprise a charge trap layer. Each cell string may further include at least one selection transistor placed over the memory cells MC. The at least one selection transistor may have the same structure as the memory cells MC and may be formed uniformly with the memory cells MC.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

A speed at which the memory cells MC1 to MC8 of the cell strings CS are erased may vary due to a characteristic of a process for fabricating the nonvolatile memory device 100 or the memory cell array 110. For example, first cell strings, which are centered with respect to the upper surface, from among the cell strings CS may have a first erase speed. Second cell strings, which are positioned at a periphery with respect to the upper surface, from among the cell strings CS may have a second erase speed.

For example, the first cell strings may be cell strings which are connected with the second and third bit lines BL2 and BL3 and are connected with the second and third string selection lines SSL2 and SSL3. The second cell strings may be cell strings which are connected with the first and fourth bit lines BL1 and BL4 and are connected with the first and fourth string selection lines SSL1 and SSL4.

For example, the second erase speed may be higher than the first erase speed. For example, in the erase operation, a speed at which charges are discharged from the first to eighth memory cells MC1 to MC8 of the second cell strings may be higher than a speed at which charges are discharged from the first to eighth memory cells MC1 to MC8 of the first cell strings.

In the case where erase speeds of cell strings are different, a threshold voltage distribution of the memory cells MC1 to MC8 in the memory block BLKa after completion of the erase operation becomes wider than when the erase speeds of the cell strings are uniform. Accordingly, in the case where a write operation is performed on the memory cells MC1 to MC8 after the erase operation, a difference (i.e., a read margin) between threshold voltages of the memory cells MC1 to MC8 of an erase state and threshold voltages of the memory cells MC1 to MC8 of a program state decreases.

In the case where the read margin decreases, the probability that a read operation for distinguishing from the erase state and the program state of the memory cells MC1 to MC8 may fail increases. That is, the reliability of the nonvolatile memory device 100 may decrease.

To solve the above issue, the nonvolatile memory device 100 according to an embodiment of the inventive concepts controls the erase speeds of the cell strings CS to be similar regardless of positions of the cell strings, the positions determined with respect to the upper surface of the cell strings CS. For example, the nonvolatile memory device 100 may control the erase speeds of the first cell strings centered with respect to the upper surface of the substrate 101 and the erase speeds of the second cell strings positioned at the periphery with respect to the upper surface of the substrate 101 to be similar.

Figure 4:
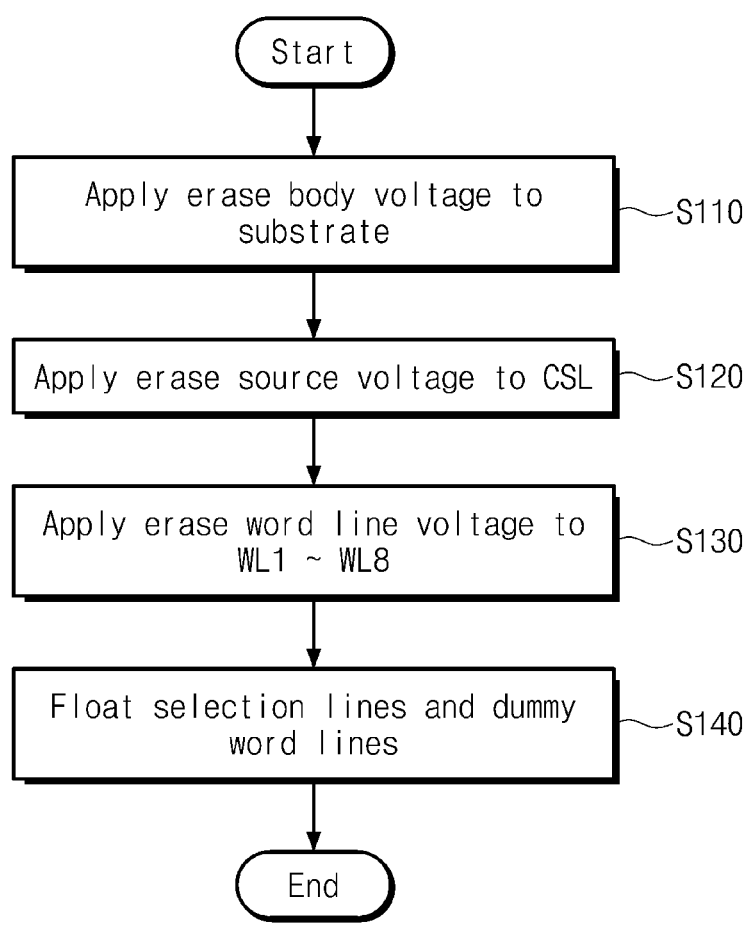
FIG. 4 illustrates a flowchart of an operating method of a nonvolatile memory device according to an embodiment of the inventive concepts.

FIG. 4 illustrates a flowchart of an operating method of the nonvolatile memory device 100 according to an embodiment of the inventive concepts. In an embodiment, an operating method of the nonvolatile memory device 100 associated with an erase operation is illustrated in FIG. 4. Referring to FIGS. 1 to 4, in operation S110, the erase body voltage generator 170 of the control logic block 160 applies the erase body voltage EBV to the substrate 101. The erase body voltage EBV may be a positive high voltage.

In operation S120, the erase source voltage generator 180 of the control logic block 160 applies the erase source voltage ESV to the common source line CSL. The erase source voltage ESV may be a positive high voltage. The erase source voltage ESV may be higher than (i.e., greater than) the erase body voltage EBV.

In operation S130, the row decoder block 120 applies an erase word line voltage to the first to eighth word lines WL1 to WL8. The erase word line voltage may be a ground voltage, or a positive or negative voltage having a level similar to a level of the ground voltage.

In operation S140, the row decoder block 120 floats selection lines including the ground selection line GSL and the string selection lines SSL, and the first to fourth dummy word lines DWL1 to DWL4. In an embodiment, selection lines including the ground selection line GSL and the string selection lines SSL may be floated at some potential other than earth ground.

When operation S110 to operation S140 are performed, threshold voltages of the memory cells MCi to MC8 in the memory block BLKa may decrease. Erase speeds of the memory cells MCi to MC8 may be controlled to be similar by applying the erase source voltage ESV.

In an embodiment, the memory block BLKa may be divided into two or more sub-blocks. For example, the memory block BLKa may be divided into two sub-blocks. The first to fourth memory cells MC1 to MC4 which are positioned below the silicon pad SP may constitute a first sub-block. The fifth to eighth memory cells MC5 to MC8 which are positioned above the silicon pad SP may constitute a second sub-block.

The first sub-block and the second sub-block may be erased independently of each other. That is, the memory cells MC1 to MC8 may be erased for each sub-block. When the first sub-block is erased, the row decoder block 120 may apply the erase word line voltage to the first to fourth word lines WL1 to WL4, and may float the fifth to eighth word lines WL5 to WL8.

When the second sub-block is erased, the row decoder block 120 may apply the erase word line voltage to the fifth to eighth word lines WL5 to WL8, and may float the first to fourth word lines WL1 to WL4.

Figure 5:
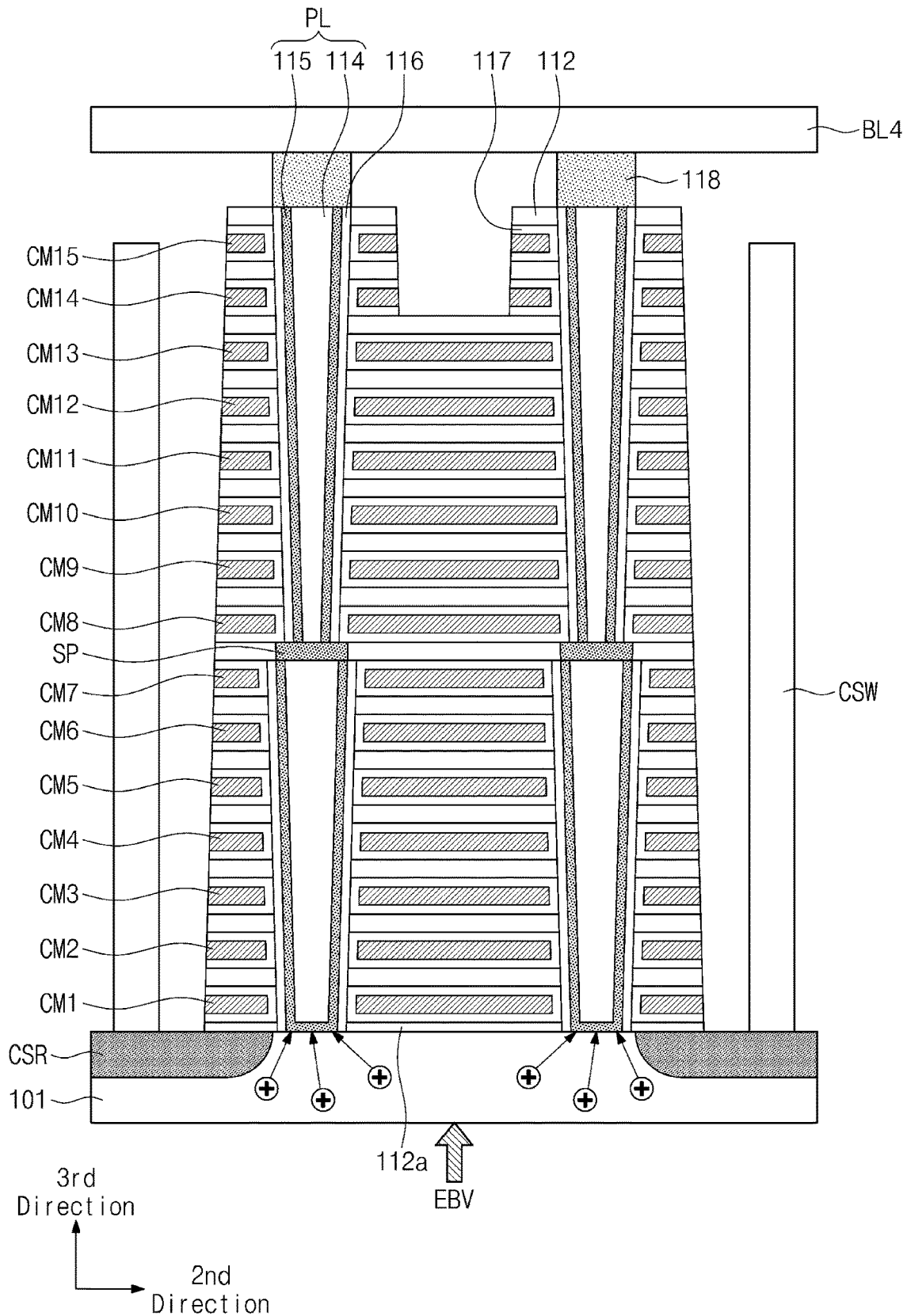
FIG. 5 illustrates a diagram of an example in which memory cells connected with a fourth bit line are erased by an erase body voltage.

FIG. 5 illustrates a diagram of an example in which memory cells connected with the fourth bit line BL4 are erased by the erase body voltage EBV. To reduce complexity of FIG. 5, some of reference numerals and reference marks mentioned in FIG. 3 are omitted.

Referring to FIGS. 1 to 3 and 5, the erase body voltage EBV is shown as applied to the substrate 101. That is, holes (+) may be supplied to the substrate 101. Since the substrate 101 and the channel layer 115 are P-type, or since the substrate 101 is P-type and the channel layer 115 is intrinsic silicon, the holes (+) supplied to the substrate 101 may be transferred to the channel layer 115.

A voltage of the channel layer 115 may be increased by the holes (+) transferred to the channel layer 115. The erase word line voltage is applied to the third to sixth conductive materials CM3 to CM6 corresponding to the first to fourth word lines WL1 to WL4. An electric field is generated by a potential difference of the channel layer 115 and the third to sixth conductive materials CM3 to CM6, and charges are discharged from the first to fourth memory cells MC1 to MC4 by the electric field.

Likewise, when the erase word line voltage is applied to the ninth to twelfth conductive materials CM9 to CM12 corresponding to the fifth to eighth word lines WL5 to WL8, charges may be discharged from the fifth to eighth word lines WL5 to WL8.

Figure 6:
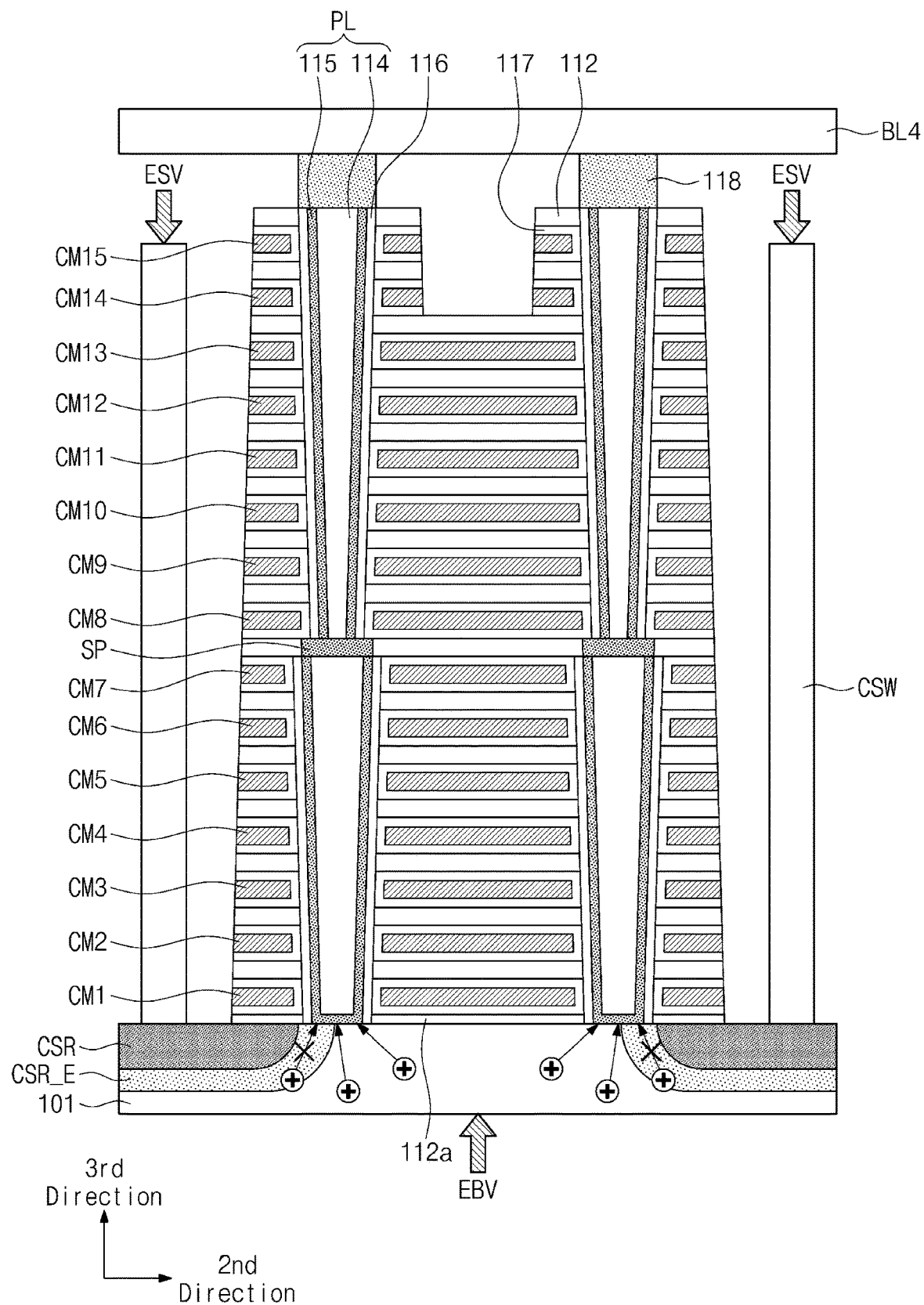
FIG. 6 illustrates a diagram of an example in which memory cells connected with a fourth bit line are erased by an erase body voltage and an erase source voltage.

FIG. 6 illustrates a diagram of an example in which memory cells connected with the fourth bit line BL4 are erased by the erase body voltage EBV and the erase source voltage ESV. To reduce complexity of FIG. 6, some of reference numerals and reference marks mentioned in FIG. 3 are omitted.

Referring to FIGS. 1 to 3 and 6, as described with reference to FIG. 5, the erase body voltage EBV is applied to the substrate 101. Unlike the description given with reference to FIG. 5, the erase source voltage ESV is shown in FIG. 6 as applied to the common source regions CSR through the common source walls CSW.

In the embodiment of FIG. 6, the common source regions CSR are N-type, and the substrate 101 is P-type. The erase source voltage ESV applied to the common source regions CSR is higher than the erase body voltage EBV applied to the substrate 101. That is, the common source regions CSR and the substrate 101 as shown in FIG. 6 are reverse-biased.

The common source region CSR may be expanded to an expanded common source region CSR_E by the reverse bias. The expanded common source region CSR_E may prevent a part of holes (+) supplied to the substrate 101 from moving to the channel layer 115 (X). Accordingly, a speed at which a voltage of the channel layer 115 is increased by the holes (+) is reduced.

In the case where the increasing speed of the voltage of the channel layer 115 decreases, an erase speed of the memory cells MC1 to MC8 in the cell strings CS may decrease. For example, the erase speed of the cell strings CS may decrease by n % (n being a positive number which is greater than "0" or is smaller than 100).

In the case where the erase speed decreases at a ratio, a decrement of an erase speed of the second cell strings having a higher erase speed is greater than a decrement of an erase speed of the first cell strings having a slower erase speed. Accordingly, erase speeds of the cell strings CS in the memory block BLKa may be controlled to be similar, and thus, the reliability of the nonvolatile memory device 100 may be improved.

Figure 7:
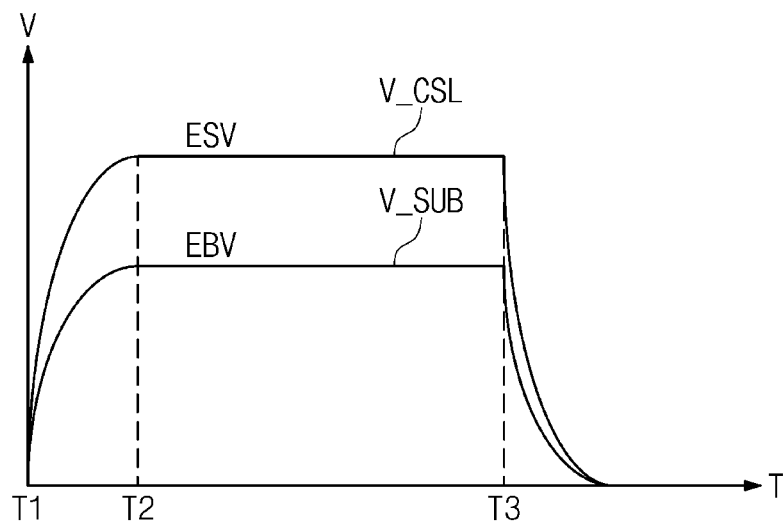
FIG. 7 illustrates a diagram of a first example in which a control logic block applies an erase body voltage and an erase source voltage.

FIG. 7 illustrates a diagram of a first example in which the control logic block 160 applies the erase body voltage EBV and the erase source voltage ESV. Referring to FIGS. 1 to 3 and 7, at a first time T1, the erase body voltage generator 170 supplies the erase body voltage EBV to the substrate 101, and the erase source voltage generator 180 supplies the erase source voltage ESV to the common source line CSL.

At a second time T2, a substrate voltage V_SUB may reach a target level of the erase body voltage EBV, and a common source line voltage V_CSL may reach a target level of the erase source voltage ESV. At a third time T3, the erase body voltage generator 170 stops the supplying of the erase body voltage EBV, and the erase source voltage generator 180 stops the supplying of the erase source voltage ESV.

That is, the erase body voltage EBV and the erase source voltage ESV may be simultaneously applied. The supplying of the erase body voltage EBV and the supplying of the erase source voltage ESV may be simultaneously stopped.

Figure 8:
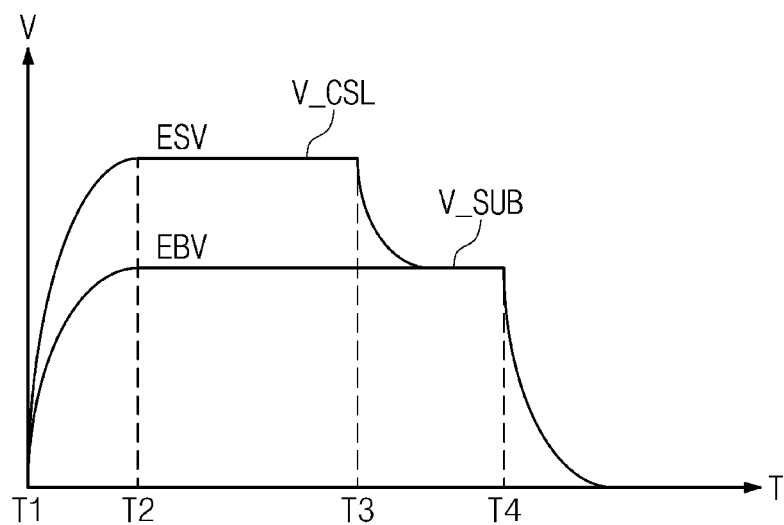
FIG. 8 illustrates a diagram of a second example in which a control logic block applies an erase body voltage and an erase source voltage.

FIG. 8 illustrates a diagram of a second example in which the control logic block 160 applies the erase body voltage EBV and the erase source voltage ESV. Referring to FIGS. 1 to 3 and 8, at a first time T1, the erase body voltage generator 170 supplies the erase body voltage EBV to the substrate 101, and the erase source voltage generator 180 supplies the erase source voltage ESV to the common source line CSL.

At a second time T2, the substrate voltage V_SUB may reach a target level of the erase body voltage EBV, and the common source line voltage V_CSL may reach a target level of the erase source voltage ESV. At a third time T3, the erase source voltage generator 180 stops the supplying of the erase source voltage ESV.

At the point in time when the supplying of the erase source voltage ESV is stopped, the common source regions CSR and the substrate 101 are reverse-biased. Accordingly, stopping the supplying of the erase source voltage ESV may decrease the common source line voltage V_CSL to the substrate voltage V_SUB. At a fourth time T4, the erase body voltage generator 170 stops the supplying of the erase body voltage EBV.

That is, the erase body voltage EBV and the erase source voltage ESV may be simultaneously applied. The supplying of the erase source voltage ESV may be stopped before the supplying of the erase body voltage EBV is stopped.

Figure 9:
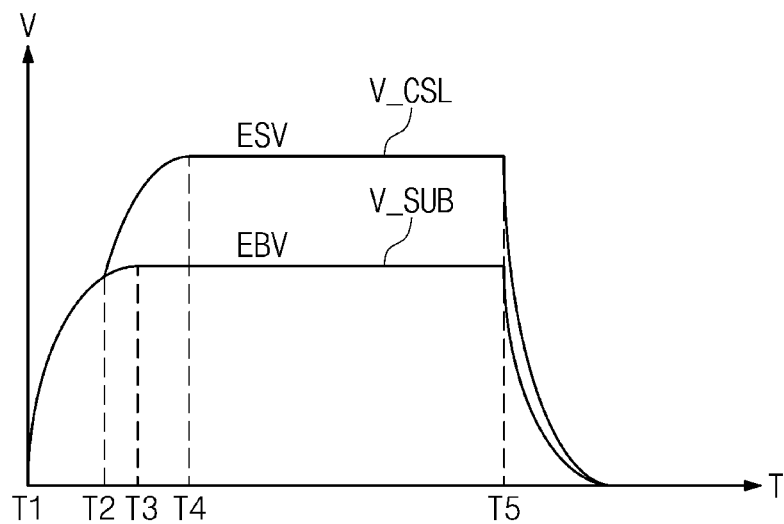
FIG. 9 illustrates a diagram of a third example in which a control logic block applies an erase body voltage and an erase source voltage.

FIG. 9 illustrates a diagram of a third example in which the control logic block 160 applies the erase body voltage EBV and the erase source voltage ESV. Referring to FIGS. 1 to 3 and 9, at a first time T1, the erase body voltage generator 170 supplies the erase body voltage EBV to the substrate 101.

In the case where the erase source voltage ESV is not supplied to the common source line CSL, the common source regions CSR and the substrate 101 are forward-biased. Accordingly, the common source line voltage V_CSL may follow the substrate voltage V_SUB.

At a second time T2, the erase source voltage generator 180 supplies the erase source voltage ESV to the common source line CSL. In this embodiment, the common source line voltage V_CSL is higher than the substrate voltage V_SUB.

At a second time T3, the substrate voltage V_SUB may reach a target level of the erase body voltage EBV. At a fourth time T4, the common source line voltage V_CSL may reach a target level of the erase source voltage ESV. At a fifth time T5, the erase source voltage generator 180 stops the supplying of the erase source voltage ESV, and the erase body voltage generator 170 stops the supplying of the erase body voltage EBV.

That is, the erase source voltage ESV may be applied after the erase body voltage EBV is applied. The supplying of the erase source voltage ESV and the supplying of the erase body voltage EBV may be simultaneously stopped.

Figure 10:
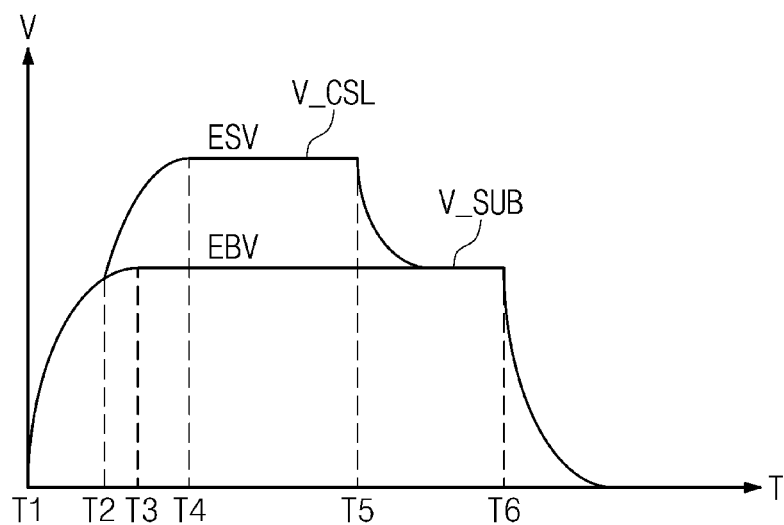
FIG. 10 illustrates a diagram of a fourth example in which a control logic block applies an erase body voltage and an erase source voltage.

FIG. 10 illustrates a diagram of a fourth example in which the control logic block 160 applies the erase body voltage EBV and the erase source voltage ESV. Referring to FIGS. 1 to 3 and 10, at a first time T1, the erase body voltage generator 170 supplies the erase body voltage EBV to the substrate 101.

In the case where the erase source voltage ESV is not supplied to the common source line CSL, the common source regions CSR and the substrate 101 are forward-biased. Accordingly, the common source line voltage V_CSL may follow the substrate voltage V_SUB.

At a second time T2, the erase source voltage generator 180 supplies the erase source voltage ESV to the common source line CSL. In this embodiment, the common source line voltage V_CSL is higher than the substrate voltage V_SUB.

At a third time T3, the substrate voltage V_SUB may reach a target level of the erase body voltage EBV. At a fourth time T4, the common source line voltage V_CSL may reach a target level of the erase source voltage ESV. At a fifth time T5, the erase source voltage generator 180 stops the supplying of the erase source voltage ESV.

At the point in time when the supplying of the erase source voltage ESV is stopped, the common source regions CSR and the substrate 101 are reverse-biased. Accordingly, stopping the supplying of the erase source voltage ESV may decrease the common source line voltage V_CSL to the substrate voltage V_SUB. At a sixth time T6, the erase body voltage generator 170 stops the supplying of the erase body voltage EBV.

That is, the erase source voltage ESV may be applied after the erase body voltage EBV is applied. The supplying of the erase source voltage ESV may be stopped before the supplying of the erase body voltage EBV is stopped.

Figure 11:
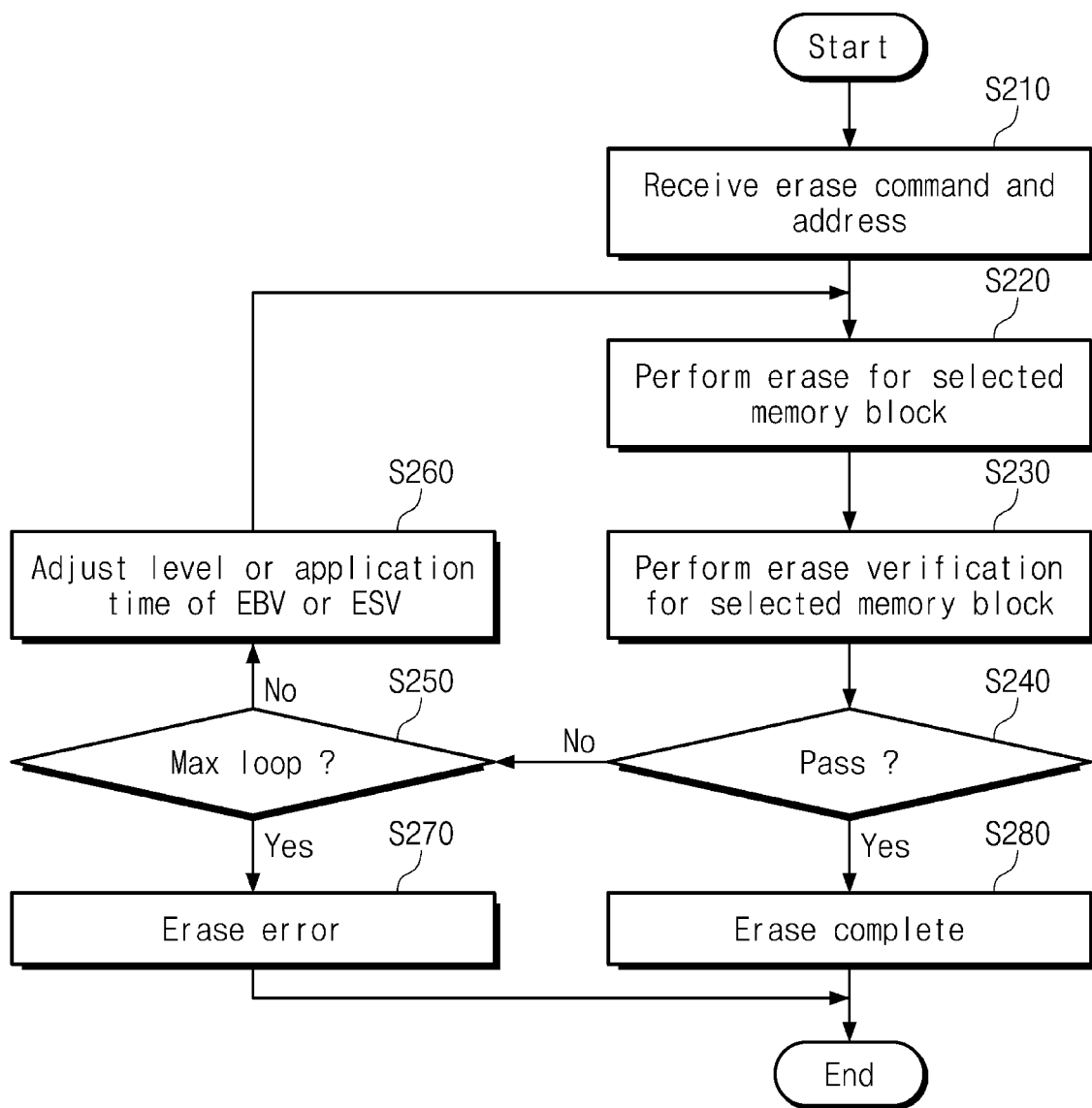
FIG. 11 illustrates a flowchart of an example in which a nonvolatile memory device performs an erase operation.

FIG. 11 illustrates a flowchart of an example in which the nonvolatile memory device 100 performs an erase operation. Referring to FIGS. 1 to 3 and 11, in operation S210, the nonvolatile memory device 100 receives an erase command and an address from a controller. The address may be directed to (or be the address of) one memory block of the memory blocks BLK1 to BLKz or one sub-block of one memory block.

In operation S220, the nonvolatile memory device 100 performs an erase operation on the selected memory block (or the selected sub-block). The erase operation may be performed according to the method described with reference to FIG. 4. For example, the erase operation may include applying the erase body voltage EBV to the substrate 101 and applying the erase source voltage ESV to the common source line CSL.

Operation S220 may be performed on the selected memory block or the selected sub-block. In the erase operation, word lines in an unselected memory block(s) or an unselected sub-block(s) may be floated.

In operation S230, the nonvolatile memory device 100 performs an erase verification operation on the selected memory block (or the selected sub-block). The erase verification operation includes an erase verification read operation and a pass-fail check operation. In the erase verification read operation, the page buffer block 130 may pre-charge the bit lines BL1 to BL4 with a power supply voltage or a positive voltage having a level which is similar to a level of the power supply voltage.

The row decoder block 120 may apply an erase verification voltage to word lines connected to selected memory cells targeted for verification. The erase verification voltage may be a ground voltage, or a positive or negative voltage having a level which is similar to a level of the ground voltage. Changes of the voltages pre-charged on the bit lines BL1 to BL4 may be sensed by the page buffer block 130 as a result of the erase verification read operation. The result of the erase verification read operation may be provided to the pass-fail check block 140.

The pass-fail check block 140 of the nonvolatile memory device 100 may perform a pass-fail check operation. For example, when the result of the erase verification read operation indicates that the number of off-cells is not smaller than a threshold value, the pass-fail check block 140 may determine a fail state of the erase operation. When the result of the erase verification read operation indicates that the number of off-cells is smaller than the threshold value, the pass-fail check block 140 may determine a pass state of the erase operation.

When the fail state is determined in operation S240 (i.e., No in operation S240), operation S250 is performed. In operation S250, the control logic block 160 of the nonvolatile memory device 100 determines whether an erase loop has reached a max loop count. For example, operation S220 to operation S240 may constitute an erase loop. The control logic block 160 may determine whether the number of erase loops performed (or repeated) has reached a max loop count.

In the case where it is determined in operation S250 that the number of erase loops performed (or repeated) has not reached the max loop count (i.e., No in operation S250), operation S260 is performed. In operation S260, the control logic block 160 adjusts a level or an application time of the erase body voltage EBV or the erase source voltage ESV.

For example, the control logic block 160 may respectively control the erase body voltage generator 170 and the erase source voltage generator 180 in operation S260 such that a level of the erase body voltage EBV and a level of the erase source voltage ESV increase.

For example, the control logic block 160 may control the erase source voltage generator 180 in operation S260 so as to adjust (e.g., delay or advance) a timing when the erase source voltage ESV is applied and a timing when the supplying of the erase source voltage ESV is stopped. After completion of operation S260, the nonvolatile memory device 100 again performs an erase loop in operation S220.

In the case where it is determined in operation S250 that the number of erase loops performed (or repeated) has reached the max loop count (i.e., Yes in operation S250), operation S270 is performed. For example, in the case where an erase pass state is not determined by the time the erase loop has reached the max loop count, operation S270 is performed. In operation S270, the control logic block 160 may determine an erase error. The control logic block 160 may report the erase error to the controller.

In the case where the pass state is determined in operation S240 (i.e., Yes in operation S240), operation S280 is performed. For example, in the case where the erase pass state is determined by the time the erase loop reaches the max loop count, operation S280 is performed. In operation S280, the control logic block 160 determines that the erase operation is completed. The control logic block 160 may report erase completion to the controller.

In an embodiment, the nonvolatile memory device 100 may determine whether to supply the erase source voltage ESV (activation or deactivation). When the supplying of the erase source voltage ESV is deactivated, the erase operation may be performed without applying the erase source voltage ESV as described with reference to FIG. 5.

When the supplying of the erase source voltage ESV is activated, the erase operation may be performed by using the erase source voltage ESV and the erase body voltage EBV as described with reference to FIG. 6. For example, whether to supply the erase source voltage ESV may be controlled by the controller.

Figure 12:
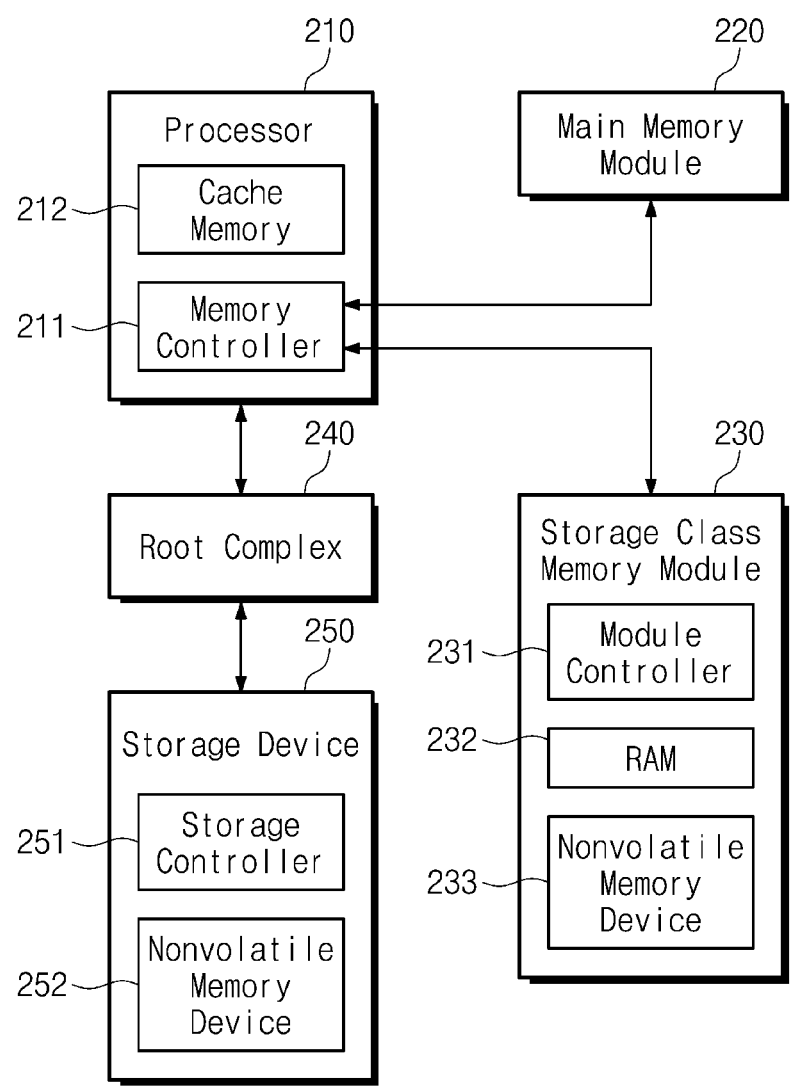
FIG. 12 illustrates a block diagram of a memory system according to an embodiment of the inventive concepts.

FIG. 12 illustrates a block diagram of a memory system 200 according to an embodiment of the inventive concepts. For example, the memory system 200 may include a server such as for example an application server, a client server, or a data server. As another example, the memory system may include a personal computer or a workstation. The memory system 200 may include a mobile device such as for example a smartphone, a smart pad, or a smart watch.

Referring to FIG. 12, the memory system 200 includes a processor 210, a main memory module 220, a storage class memory module 230, a root complex 240, and a storage device 250. The processor 210 may control components of the memory system 200 and operations of the components. The processor 210 may execute an operating system and applications and may process data by using the operating system and the applications.

The processor 210 may include a memory controller 211 and a cache memory 212. The memory controller 211 may control the main memory module 220 and the storage class memory module 230. For example, the memory controller 211 may control the main memory module 220 and the storage class memory module 230 in compliance with the same communication standard. The cache memory 212 may include high-speed memory such as static random access memory (SRAM).

The main memory module 220 and the storage class memory module 230 may be used as a main memory of the memory system 200. The main memory module 220 and the storage class memory module 230 may communicate with the memory controller 211 in compliance with standards of memory modules such as for example dual in-line memory module (DIMM), registered DIMM (RDIMM), and load reduced DIMM (LRDIMM).

The main memory module 220 may include random access memory such as dynamic random access memory (DRAM). The random access memory may be directly accessed by the memory controller 211. The main memory module 220 may provide the random access memory as a storage space of the memory controller 211.

The storage class memory module 230 may include a module controller 231, a random access memory 232, and a nonvolatile memory device 233. The module controller 231 may control the random access memory 232 and the nonvolatile memory device 233 in response to a request of the memory controller 211.

For example, the storage class memory module 230 may provide the nonvolatile memory device 233 as a storage space of the memory controller 211. The storage class memory module 230 may use the random access memory 232 as a cache memory associated with the nonvolatile memory device 233. The random access memory 232 may be directly accessed by the memory controller 211.

The module controller 231 may back up data, which are absent from the random access memory 232, from among data which the memory controller 211 requests, from the nonvolatile memory device 233 to the random access memory 232. The module controller 231 may flush data stored in the random access memory 232 to the nonvolatile memory device 233.

The root complex 240 may provide channels through which the processor 210 accesses various peripheral devices. For example, the storage device 250 may be connected to the root complex 240. The storage device 250 may for example include a hard disk drive, an optical disk drive, a solid state drive, or the like.

For example, the storage device 250 may include a storage controller 251 and a nonvolatile memory device 252. The storage controller 251 may access the nonvolatile memory device 252 depending on a request transmitted from the processor 210 through the root complex 240.

For example, the storage controller (i.e., controller) 251 may issue a write command, a read command, or an erase command to the nonvolatile memory device 252. By using the write command, the storage controller 251 may write data transmitted from the main memory module 220 or the storage class memory module 230 through the root complex 240, in the nonvolatile memory device 252.

By using the read command, the storage controller 251 may read data stored in the nonvolatile memory device 252. The storage controller 251 may transmit the read data to the main memory module 220 or the storage class memory module 230 through the root complex 240.

In an embodiment, the nonvolatile memory device 233 or the nonvolatile memory device 252 may include the nonvolatile memory device 100 (refer to FIG. 1) according to an embodiment of the inventive concepts. During an erase operation, the nonvolatile memory device 233 or the nonvolatile memory device 252 may be configured to apply the erase body voltage EBV to the substrate 101 (refer to FIGS. 2 and 3) and to apply the erase source voltage ESV to the common source line CSL.

Erase speeds of the cell strings CS in the nonvolatile memory device 233 or the nonvolatile memory device 252 may be controlled to be similar by applying the erase source voltage ESV to the common source line CSL. Accordingly, the reliability of the nonvolatile memory device 233 or the nonvolatile memory device 252, the storage class memory module 230 including the nonvolatile memory device 233, the storage device 250 including the nonvolatile memory device 252, and the memory system 200 including the nonvolatile memory device 233 or the nonvolatile memory device 252 may be improved.

In an embodiment, the module controller (i.e., controller) 231 may control whether to supply the erase source voltage ESV during an erase operation of the nonvolatile memory device 233. For example, in a specific memory block, as the number of program/erase cycles increases, the erase speed of the specific memory block may increase.

For example, the module controller 231 may deactivate the application of the erase source voltage ESV when the number of program/erase cycles associated with a selected memory block is smaller than a threshold value. The module controller 231 may activate the application of the erase source voltage ESV when the number of program/erase cycles associated with the selected memory block is not smaller than the threshold value.

As in the above description, the storage controller 251 may control whether to supply the erase source voltage ESV during an erase operation of the nonvolatile memory device 252. For example, the storage controller 251 may deactivate the application of the erase source voltage ESV when the number of program/erase cycles associated with a selected memory block is smaller than a threshold value. The storage controller 251 may activate the application of the erase source voltage ESV when the number of program/erase cycles associated with the selected memory block is not smaller than the threshold value.

In the above-described embodiments, components according to embodiments of the inventive concepts are referred to by using the term "block". The "block" may be implemented with various hardware devices, such as an integrated circuit, an application specific IC (ASCI), a field programmable gate array (FPGA), and a complex programmable logic device (CPLD), software, such as firmware and applications driven in hardware devices, or a combination of a hardware device and software. Also, "block" may include circuits or intellectual property (IP) implemented with semiconductor devices.

According to the inventive concepts, in a nonvolatile memory device, a voltage higher than a voltage applied to a substrate is applied to a common source line during an erase operation. Accordingly, an erase speed of cell strings decreases. In particular, an erase speed of cell strings, which is higher than an erase speed of any other cell strings, is decreased more greatly than the erase speed of the other cell strings. As such, the erase speeds of the cell strings may be equalized, and a distribution of threshold voltages of erased memory cells becomes narrower, improving reliability of the nonvolatile memory device.

While the inventive concepts have been described with reference to exemplary embodiments thereof, it will be apparent to those of ordinary skill in the art that various changes and modifications may be made thereto without departing from the spirit and scope of the inventive concepts as set forth in the following claims.

What is claimed is:

1. A nonvolatile memory device comprising:
    a memory cell array including memory blocks, wherein each of the memory blocks includes cell strings each comprising a ground selection transistor, memory cells, and a string selection transistor stacked in a direction perpendicular to a substrate;
    an erase body voltage generator configured to apply an erase body voltage to the substrate during an erase operation; and
    an erase source voltage generator configured to apply an erase source voltage to a common source line connected with the ground selection transistor of the cell strings during the erase operation,
    wherein the erase source voltage is greater than the erase body voltage.

2. The nonvolatile memory device of claim 1, wherein the substrate comprises a common source region in a region of the substrate adjacent to the ground selection transistor, a conductivity of the common source region is different than a conductivity of the substrate, and the common source line comprises the common source region.

3. The nonvolatile memory device of claim 1, wherein the erase source voltage generator is configured to start applying the erase source voltage to the common source line at a same time that the erase body voltage generator starts applying the erase body voltage to the substrate.

4. The nonvolatile memory device of claim 1, wherein the erase source voltage generator is configured to stop applying the erase source voltage to the common source line at a same time that the erase body voltage generator stops applying the erase body voltage to the substrate.

5. The nonvolatile memory device of claim 1, wherein the erase source voltage generator is configured to start applying the erase source voltage to the common source line after the erase body voltage generator starts applying the erase body voltage to the substrate.

6. The nonvolatile memory device of claim 1, wherein the erase source voltage generator is configured to stop applying the erase source voltage to the common source line while the erase body voltage generator applies the erase body voltage to the substrate.

7. The nonvolatile memory device of claim 1, wherein the erase operation includes erase loops, each of the erase loops includes performing erasing and performing erase verification, and the erase body voltage generator and the erase source voltage generator are configured to respectively apply the erase body voltage and the erase source voltage during the erasing.

8. The nonvolatile memory device of claim 7, wherein the erase operation progresses to a next erase loop among the erase loops when a pass state is not determined during the erase verification.

9. The nonvolatile memory device of claim 8, wherein a level of at least one of the erase body voltage and the erase source voltage is adjusted in the next erase loop.

10. The nonvolatile memory device of claim 9, wherein a level of the erase body voltage and a level of the erase source voltage increase in the next erase loop.

11. The nonvolatile memory device of claim 8, wherein an application time of at least one of the erase body voltage and the erase source voltage is adjusted in the next erase loop.

12. The nonvolatile memory device of claim 8, wherein the erase source voltage generator is configured to adjust a timing of applying the erase source voltage in the next erase loop.

13. The nonvolatile memory device of claim 8, wherein the erase source voltage generator is configured to adjust a timing to stop applying the erase source voltage in the next erase loop.

14. A nonvolatile memory device comprising:
a memory cell array including memory blocks, wherein each of the memory blocks includes cell strings each comprising a ground selection transistor, memory cells, and a string selection transistor stacked in a direction perpendicular to a substrate;
an erase body voltage generator configured to apply an erase body voltage to the substrate during an erase operation,
wherein the substrate comprises a common source region in a region of the substrate adjacent to the ground selection transistor of the cell strings, a conductivity of the common source region is different than a conductivity of the substrate; and
an erase source voltage generator configured to apply an erase source voltage to the common source region to expand the common source region when the erase body voltage is applied to the substrate,
wherein the common source region is expanded to a region where a channel of the ground selection transistor and the substrate contact each other.

15. The nonvolatile memory device of claim 14, wherein the erase source voltage is greater than the erase body voltage.

16. A memory system comprising:
a controller configured to issue an erase command; and
a nonvolatile memory device configured to perform an erase operation based on the erase command,
wherein the nonvolatile memory device includes
a memory cell array including memory blocks, each of the memory blocks including a plurality of cell strings each comprising a ground selection transistor, memory cells, and a string selection transistor stacked in a direction perpendicular to a substrate,
an erase body voltage generator configured to apply an erase body voltage to the substrate during the erase operation, and
an erase source voltage generator configured to apply an erase source voltage to a common source line connected with the ground selection transistor of the cell strings during the erase operation,
wherein the erase source voltage is greater than the erase body voltage.

17. The memory system of claim 16, wherein the controller is configured to control the nonvolatile memory device based on a request of an external host device, and
wherein the controller and the nonvolatile memory device constitute a solid state drive.

18. The memory system of claim 16, further comprising:
a random access memory accessed based on a request of an external host device or under control of the controller,
wherein the controller, the nonvolatile memory device, and the random access memory constitute a storage class memory module.

* * * * *